United States Patent
Kim et al.

(10) Patent No.: US 10,192,595 B2
(45) Date of Patent: Jan. 29, 2019

(54) LEVEL SHIFTER AND OPERATION METHOD THEREOF

(71) Applicant: SK hynix Inc., Gyeonggi-do (KR)

(72) Inventors: Tae-Gyu Kim, Gyeonggi-do (KR); Yong-Seop Lee, Gyeonggi-do (KR); Do-Hee Kim, Sejong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/496,426

(22) Filed: Apr. 25, 2017

(65) Prior Publication Data
US 2018/0047433 A1 Feb. 15, 2018

(30) Foreign Application Priority Data
Aug. 9, 2016 (KR) .......................... 10-2016-0101236

(51) Int. Cl.
*G11C 7/10* (2006.01)
*G11C 7/12* (2006.01)
*G11C 7/22* (2006.01)
*H03K 19/0175* (2006.01)

(52) U.S. Cl.
CPC .................. *G11C 7/12* (2013.01); *G11C 7/10* (2013.01); *G11C 7/1084* (2013.01); *G11C 7/22* (2013.01); *H03K 19/0175* (2013.01)

(58) Field of Classification Search
CPC ................. G11C 7/10; G11C 7/12; G11C 7/22
USPC ........................................ 365/189.09
See application file for complete search history.

(56) References Cited

U.S. PATENT DOCUMENTS 7,397,278 B2 * 7/2008 Nakao .................. G09G 3/3685
326/68
8,384,431 B2 * 2/2013 Barrow .............. H03K 3/35613
326/68

FOREIGN PATENT DOCUMENTS

KR 101174846 8/2012

* cited by examiner

*Primary Examiner* — Son Mai
(74) *Attorney, Agent, or Firm* — IP & T Group LLP

(57) ABSTRACT

A level shifter includes an input control unit suitable for outputting an output control signal according to a pulse width of a data signal and a pulse width of an input control signal; and an output control unit suitable for controlling an output driving signal according to the output control signal.

18 Claims, 3 Drawing Sheets

LEVEL SHIFTER AND OPERATION METHOD THEREOF

CROSS-REFERENCE TO RELATED APPLICATIONS

The present application claims priority of Korean Patent Application No. 10-2016-0101236, filed on Aug. 9, 2016, which is incorporated herein by reference in its entirety.

BACKGROUND

1. Field

Exemplary embodiments of the present invention relate to a level shifter, and more particularly, to a level shifter capable of reducing a switching noise, consuming a low power with a small size and a high speed operation and an operation method thereof.

2. Description of the Related Art

In a semiconductor device, typically, most circuit blocks use the same voltage, however, sometimes may use different voltages depending on the function performed. A level shifting device is used for interfacing between circuits that use different voltage levels in a semiconductor device. The level shifting device converts a signal having a low voltage level into a signal having a high voltage level, and vice versa.

That is, the level shifting device is used for converting a voltage level of a signal in order to reduce voltage level difference among internal circuit blocks of the semiconductor device and voltage level difference of signals between the semiconductor device and an external device.

Meanwhile, a display device and an image sensor may transfer driving information or sensing pixel information through a switch provided to each of pixels having an active matrix structure, which may be applied to a memory device. That is, a read operation, a write operation and an erase operation of a NAND memory for performing a sequential control may be performed using an active matrix structure.

Herein, a control of an active matrix structure may be basically performed using a row driver and a column driver, and may be variously implemented according to a control type. Basically, in order to implement an optimized design, a level shifting device includes a low shift resistor, a level shifter and a high level buffer.

The low shift resistor generates a sequential signal which drives each of a plurality of rows or each of a plurality of columns. The level shifter converts the sequential signal into a voltage level requested by a display device a sensor, or a memory device, etc. The high level buffer drives a load with the converted voltage level.

As described above, a structure of a typical level shifting device includes a level shifter of a latch type and a high level buffer, which are separately implemented. That is, the level shifter of the latch type needs an input variation having a greater level than a predetermined level, which has a structural problem that the typical level shifting device is not appropriate to directly drive a high level or a low level. Thus, a buffer must be separately implemented.

SUMMARY

Various embodiments of the present invention are directed to a level shifter for controlling an output signal by adjusting a pulse width of a data signal and adjusting a voltage value at a specific node, and an operation method thereof.

In an embodiment of the present invention, a level shifter may include an input control unit suitable for outputting an output control signal according to a pulse width of a data signal and a pulse width of an input control signal; and an output control unit suitable for controlling an output driving signal according to the output control signal.

The input control unit may include a transistor, which receives the input control signal through a gate terminal thereof, the data signal through a drain terminal thereof, and output the output control signal to a source terminal thereof according to the pulse widths of the data signal and the input control signal.

The transistor may output a first output control signal to the source terminal when the pulse width of the data signal is wider than the pulse width of the input control signal, and output a second output control signal to the source terminal when the pulse width of the data signal is narrower than the pulse width of the input control signal.

The output control unit may include a storage unit suitable for storing a voltage value according to the output control signal; and an output unit suitable for outputting or blocking the output driving signal according to the voltage value stored in the storage unit.

The storage unit may include a capacitor, which stores the voltage value according to the first output control signal when the pulse width of the data signal is wider than the pulse width of the input control signal, and which does not store the voltage value according to the second output control signal when the pulse width of the data signal is narrower than the pulse width of the input control signal.

The output unit may include a transistor, which receives the voltage value stored in the storage unit through a gate terminal thereof, the output driving signal through a drain terminal thereof, and outputs or blocks the output driving signal as the output signal through a source terminal thereof according to the voltage value stored in the storage unit.

The transistor may be switched on and output the output driving signal as the output signal through the source terminal when the voltage value of the storage unit is applied through the gate terminal, and switched off and blocks the output driving signal.

The level shifter may further include a high level buffer suitable for driving load with the voltage level of the output signal outputted from the output control unit.

In another embodiment of the present invention, a level shifting method may include adjusting a pulse width of a data signal; maintaining a voltage value according to the adjusted pulse width of the data signal and a pulse width of an input signal; and controlling an output of an output driving signal according to a maintained voltage value.

The adjusting of the pulse width of the data signal may include adjusting the data signal to have a wider pulse width than the pulse width of the input control signal, or to have a narrower pulse width than a pulse width of the input control signal.

The level shifting method may further include driving a load with a voltage level of the output driving signal.

In another embodiment of the present invention, a semiconductor memory device having a level shifter may include an input control unit suitable for outputting an output control signal according to a pulse width of a data signal and a pulse width of an input control signal; and an output control unit suitable for controlling an output driving signal according to the output control signal.

The output control unit may include a storage unit suitable for storing a voltage value according to the output control signal; and an output unit suitable for outputting or blocking the output driving signal according to the voltage value stored in the storage unit.

The storage unit may include a capacitor, which stores the voltage value according to the first output control signal when the pulse width of the data signal is wider than the pulse width of the input control signal, and which does not store the voltage value according to the second output control signal when the pulse width of the data signal is narrower than the pulse width of the input control signal.

DETAILED DESCRIPTION

Figure 1A:
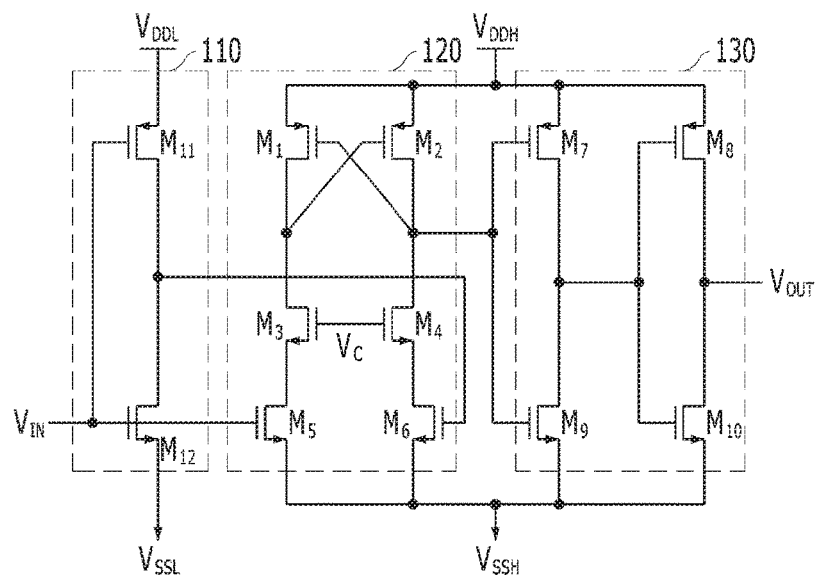
FIG. 1A is a circuit diagram illustrating a typical level shifting device.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Throughout the specification, when an element is referred to as being "coupled" to another element, it may not only indicate that the elements are "directly coupled" to each other, but also indicate that the elements are "electrically coupled" to each other with another element interposed therebetween.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily drawn to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It ill be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail to avoid unnecessarily obscuring the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1B:
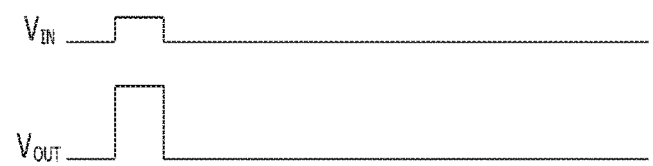
FIG. 1B is a diagram illustrating an input signal and an output signal of a typical level shifting device.

FIG. 1A is a circuit diagram illustrating a typical level shifting device. FIG. 1B is a diagram illustrating an input signal and an output signal of the typical level shifting device.

As shown in FIG. 1A, the typical level shifting device includes a low shift resistor 110, a level shifter 120 and a high level buffer 130.

The low shift resistor 110 generates a sequential signal for driving each row or each column. The level shifter 120 converts the sequential signal into a voltage level required from a display device, a sensor or a memory device. The high level buffer 130 drives a load with the converted voltage level.

Herein, the low shift resistor 110 may be implemented as an inverter type, the level shifter 120 may be implemented as an amplifier type, and the high level buffer 130 may be implemented as a buffer type. The low shift resistor 110 operates with a first ground voltage $V_{SSL}$ and a first power supply voltage $V_{DDL}$ having a low voltage level. The level shifter 120 and the high level buffer 130 operate with a second ground voltage $V_{SSH}$ and a second power supply voltage $V_{DDH}$ which are respectively higher than the first ground voltage $V_{SSL}$ and the first power supply voltage $V_{DDL}$.

As shown in FIG. 1B, if an input signal $V_{IN}$ is shifted from a low voltage level to a high voltage level, an output signal phase of the typical level shifting device is varied, and an output signal $V_{OUT}$ of the typical level shifting device is varied to a high voltage level.

Referring back to FIG. 1A, a third transistor M3 and a fourth transistor M4 included in the level shifter 120 are respectively coupled to drain terminals of a fifth transistor M5 and a sixth transistor M6, and receive a specific voltage $V_C$ through gate terminals thereof. A high voltage level at the drain terminals of a fifth transistor M5 and a sixth transistor M6 having great voltage potential difference from a voltage $V_{SSH}$ of source terminals of the fifth transistor M5 and the sixth transistor M6 may cause damage of the fifth transistor M5 and the sixth transistor M6. The third transistor M3 and the fourth transistor M4 prevent the fifth transistor M5 and the sixth transistor from damage due to a great voltage potential difference.

The above-described typical level shifting device having a positive feedback structure of a latch type although it is structurally stable it may have the following disadvantages.

First, the above-described typical level shifting device which has a positive feedback structure requires a large input signal for changing its output signal phase, and a large current flowing during the change of the output signal phase.

More specifically, since the first and second transistors $M_1$ and $M_2$ of the level shifter 120 are coupled in a positive feedback structure, a large power is required to change the output signal phase of the typical level shifting device. For example, when a gate of the first transistor $M_1$ has a low voltage level, a drain voltage of the first transistor $M_1$ may be changed when a current flowing through the fifth transistor $M_5$ is larger than a current flowing through the first transistor $M_1$. That is, since a drain current of the fifth transistor $M_5$ needs to change a current of the first transistor $M_1$ in order to change the output signal phase of the typical level shifting device, a large current is required and the fifth transistor $M_5$ and the sixth transistor $M_6$ need to have a large size in order to change the output signal phase of the typical level shifting device at a high speed.

Thus, when several thousands of level shifting devices operate to control each pixel of an active matrix structure, a switch noise may be greatly generated.

Second, it is not practical to increase a size of the first transistor $M_1$ and the second transistor $M_2$ included in the level shifter 120 of the typical level shifting device shown in FIG. 1A because the larger the first transistor $M_1$ and the second transistor $M_2$, the more input current they need.

Thus, since a load may not be driven using a low voltage level, a high level buffer 130 for driving the load is needed. That is, since the first transistor M1 and the second transistor $M_2$ must be manufactured to have a small size, a speed of a phase change of the output signal is very slow when the output signal of the typical level shifting device is directly provided to the load. Thus, the high level buffer 130 is needed and this increases the needed area and the power consumption.

Additionally, since the typical level shifting device shown in FIG. 1A has a complementary metal oxide semiconductor (CMOS) structure which needs a P-well and an N-well, an area of the typical level shifting device is additionally increased and this causes the increase of a total size of the typical level shifting device.

Figure 2:
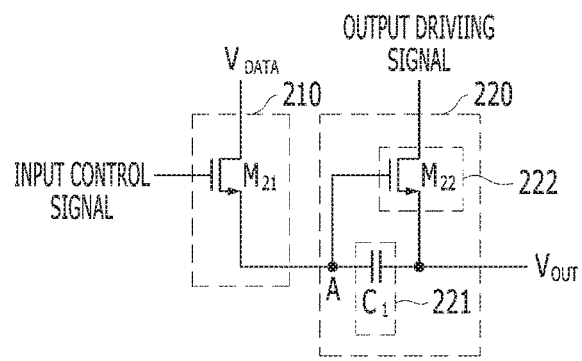
FIG. 2 is a circuit diagram illustrating a level shifter in accordance with an embodiment of the present invention.

FIG. 2 is a circuit diagram illustrating a level shifter in accordance with an embodiment of the present invention. The level shifter 120 of the level shifting device shown in FIG. 1A may be replaced by the level shifter shown in FIG. 2.

Referring to FIG. 2, a level shifter in accordance with an embodiment of the present invention includes an input control unit 210 for outputting an output control signal in response to pulse widths of an input control signal and a data signal $V_{DATA}$, and an output control unit 220 for controlling an output driving signal in response to the output control signal outputted from the input control unit 210.

The input control unit 210 receives the input control signal through a gate terminal, receives the data signal $V_{DATA}$ through a drain terminal, and outputs the output control signal to a source terminal responsive to the pulse widths of the input control signal and the data signal $V_{DATA}$.

A first transistor $M_{21}$ of the input control unit 210 may be implemented as a first NMOS transistor, which outputs through the source terminal a first output control signal when a pulse width of the input control signal is wider than a pulse width of the data signal $V_{DATA}$ and a second output control signal when a pulse width of the input control signal is narrower than a pulse width of the data signal $V_{DATA}$.

Herein, the data signal $V_{DATA}$ and the input control signal may be sequentially applied like a clock signal. The input control signal may be applied from an external control unit (not shown), and the data signal $V_{DATA}$ may be provided from the low shift resistor 110 shown in FIG. 1A.

The output control unit 220 includes a storage unit 221 for storing a voltage value according to the output control signal outputted from the input control unit 210, and an output unit 222 for outputting or blocking the output driving signal as an output signal $V_{OUT}$ of the level shifter according to a voltage value stored in the storage unit 221.

The storage unit 221 may be implemented with a capacitor $C_1$, which stores a voltage value according to the first output control signal outputted from the input control unit 210 in case that the pulse width of the data signal $V_{DATA}$ is wider than the pulse width of the input control signal. Further, the capacitor $C_1$ as the storage unit 221 does not store a voltage value according to the second output control signal outputted from the input control unit 210 in case that the pulse width of the data signal $V_{DATA}$ is narrower than the pulse width of the input control signal.

The output unit 222 includes a second transistor $M_{22}$, which receives the voltage value stored in the storage unit 221 through a gate terminal, receives the output driving signal through a drain terminal, and outputs or blocks the output driving signal as the output signal $V_{OUT}$ through a source terminal according to the voltage value stored in the storage unit 221.

The second transistor $M_{22}$ may be implemented as a second NMOS transistor. The second NMOS transistor $M_{22}$ is switched on and outputs the output driving signal, which is inputted through the drain terminal, as the output signal $V_{OUT}$ through the source terminal if the voltage value stored in the storage unit 221 is applied to the gate terminal of the second NMOS transistor $M_{22}$. The second NMOS transistor $M_{22}$ is switched off and blocks the output driving signal, which is inputted through the drain terminal, as the output signal $V_{OUT}$ through the source terminal if the voltage value stored in the storage unit 221 is not applied to the gate terminal of the second NMOS transistor $M_{22}$. Preferably, the second NMOS transistor $M_{22}$ may be implemented with a high voltage level transistor.

Herein, the output driving signal may be sequentially applied from an external control unit (not shown).

Meanwhile, since the level shifter in accordance with an embodiment of the present invention may perform a combined function of a level shifter and a buffer, a high level buffer is not needed at a next stage of the level shifter. But, for more stable driving of a load, a high level buffer for driving the load with the output signal $V_{OUT}$ outputted from the output control unit 220 may be further provided.

Furthermore, the level shifter in accordance with an embodiment of the present invention may be implemented using same type transistors such as NMOS transistors or PMOS transistors.

As described above, the level shifter in accordance with an embodiment of the present invention may adjust a voltage value of a specific node (A node of the first and second output control signals outputted from the input control unit 210) by adjusting a pulse width of the data signal $V_{DATA}$, and may reduce a switching noise by not generating a spike of a switching current because a current path is not formed between a power supply voltage and a ground voltage due to the implementation of a single element when a switching operation is performed. Also, the level shifter in accordance with an embodiment of the present invention may operate with a lower power consumption, a small size and at high speed by combining a function of a level shifter and with a function of a buffer.

Figure 3A:
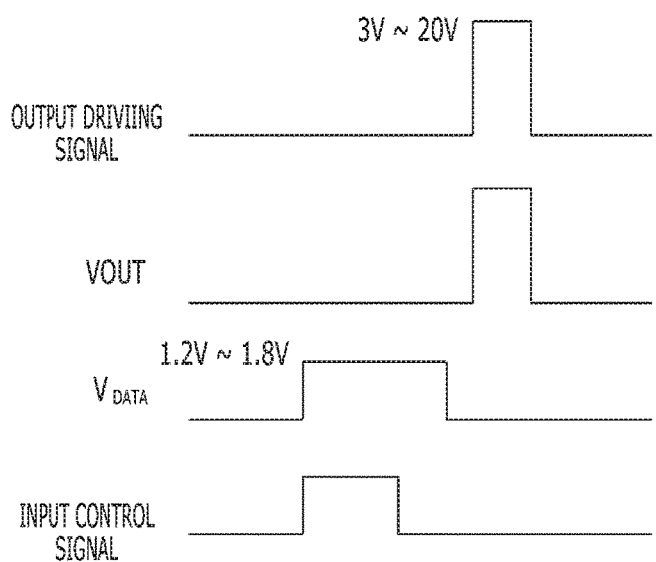
FIGS. 3A and 3B are timing diagrams illustrating an operation of the level shifter of FIG. 2.
Figure 3B:
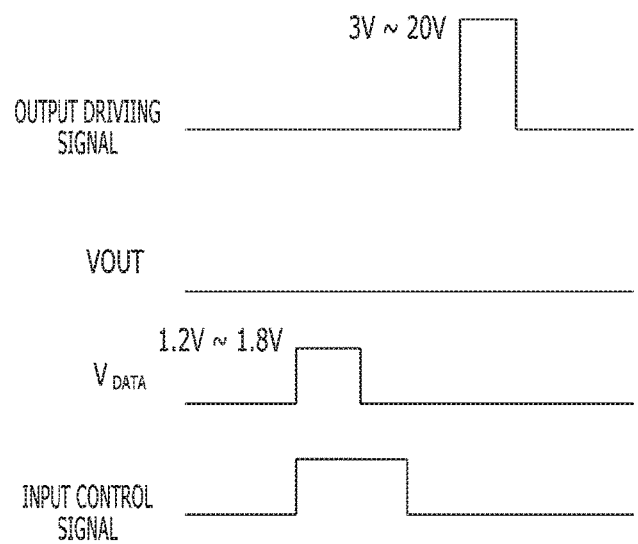
Figure 4:
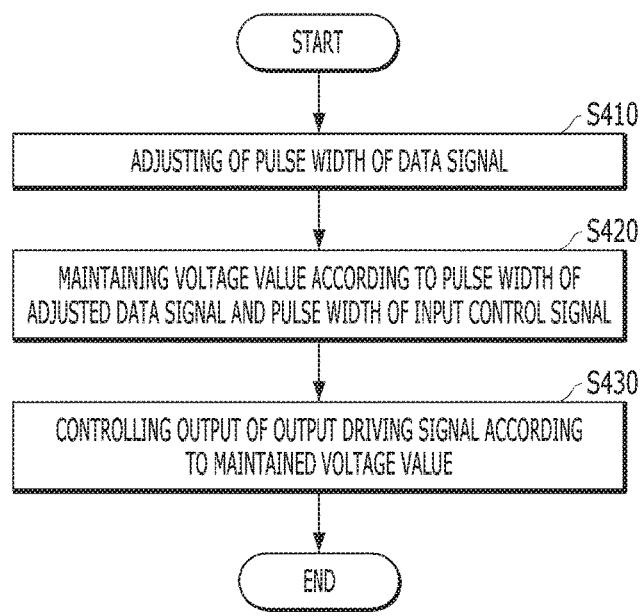
FIG. 4 is a flow chart illustrating the operation of the level shifter of FIG. 2.

FIGS. 3A and 3B are timing diagrams illustrating the level shifter of FIG. 2, and FIG. 4 is a flow chart illustrating an operation of the level shifter of FIG. 2.

A pulse width of the data signal $V_{DATA}$ is adjusted at step S410. This step adjusting process may be performed by an external control unit (not shown). Specifically, the data signal $V_{DATA}$ may be adjusted to have a wider pulse width than the input control signal as shown in FIG. 3A, or may be adjusted to have a narrower pulse width than the input control signal as shown in FIG. 3B.

At step S420, voltage values corresponding to an adjusted pulse width of the data signal $V_{DATA}$ and the pulse width of the input control signal are maintained according to the pulse width of the input control signal and the pulse width of the adjusted data signal. More specifically, the storage unit 221 of FIG. 2 stores the voltage value according to the first output control signal outputted from the input control unit 210 of FIG. 2 when the adjusted pulse width of the data signal $V_{DATA}$ is wider than the pulse width of the input control signal as shown in FIG. 3A. The storage unit 221 of FIG. 2 does not store the voltage value according to the second output control signal outputted from the input control unit 210 of FIG. 2 when the adjusted pulse width of the data signal $V_{DATA}$ is narrower than the pulse width of the input control signal as shown in FIG. 3A.

Subsequently, at step S430, an output of the output driving signal is controlled according to the maintained voltage value. That is, as shown in FIG. 3A, the second NMOS transistor $M_{22}$ is switched on, and outputs the output driving signal, which is inputted through the drain terminal thereof, as the output signal $V_{OUT}$ through the source terminal thereof if the voltage value maintained in the storage unit 221 is applied to the gate terminal thereof. And, as shown in FIG. 3B, the second NMOS transistor $M_{22}$ is switched off, and blocks the output driving signal, which is inputted through the drain terminal thereof, as the output signal $V_{OUT}$ through the source terminal thereof if the voltage value is not applied from the storage unit 221 through the gate terminal thereof.

As described above, since the level shifter using same type transistors (e.g., PMOS transistors or NMOS transistors) in accordance with an embodiment of the present invention is driven by the output driving signal (e.g., output clock) after a calculation is performed at a low voltage region, unlike the typical level shifter, the PMOS transistor and the NMOS transistor can be not switched on at the same time due to the use of same type transistors. Thus, since a switching current is not generated, a lower power consumption may be implemented in the level shifter in accordance with an embodiment of the present invention.

Moreover, the level shifter in accordance with an embodiment of the present invention may be implemented with same type transistors, hence, a layout area may be reduced.

Furthermore, the level shifter in accordance with an embodiment of the present invention may reduce a switching noise since a switching current spike is not generated.

Although various embodiments of the present invention have been described for illustrative purposes, it will be apparent to those skilled in the art that various changes and modifications may be made without departing from the spirit and scope of the invention as defined in the following claims.

What is claimed is:

1. A level shifter, comprising:
   an input control unit suitable for outputting an output control signal according to a pulse width of a data signal and a pulse width of an input control signal; and
   an output control unit suitable for controlling an output driving signal according to the output control signal.

2. The level shifter of claim 1, wherein the input control unit includes a transistor, which receives the input control signal through a gate terminal thereof, the data signal through a drain terminal thereof, and outputs the output control signal to a source terminal thereof according to the pulse widths of the data signal and the input control signal.

3. The level shifter of claim 2, wherein the transistor outputs a first output control signal to the source terminal when the pulse width of the data signal is wider than the pulse width of the input control signal, and outputs a second output control signal to the source terminal when the pulse width of the data signal is narrower than the pulse width of the input control signal.

4. The level shifter of claim 1, wherein the output control unit includes:
   a storage unit suitable for storing a voltage value according to the output control signal; and
   an output unit suitable for outputting or blocking the output driving signal according to the voltage value stored in the storage unit.

5. The level shifter of claim 4, wherein the storage unit includes a capacitor, which stores the voltage value according to the first output control signal when the pulse width of the data signal is wider than the pulse width of the input control signal, and which does not store the voltage value according to the second output control signal when the pulse width of the data signal is narrower than the pulse width of the input control signal.

6. The level shifter of claim 4, wherein the output unit includes a transistor, which receives the voltage value stored in the storage unit through a gate terminal of the transistor, the output driving signal through a drain terminal of the transistor, and outputs or blocks the output driving signal as an output signal through a source terminal of the transistor according to the voltage value stored in the storage unit.

7. The level shifter of claim 6, wherein the transistor is switched on and outputs the output driving signal as the output signal through the source terminal when the voltage value of the storage unit is applied through the gate terminal, and switched off and blocks the output driving signal.

8. The level shifter of claim 1, further comprising a high level buffer suitable for driving a load with the voltage level of the output signal outputted from the output control unit.

9. A level shifting method, comprising:
   adjusting a pulse width of a data signal;
   maintaining a voltage value according to the adjusted pulse width of the data signal and a pulse width of an input signal; and
   controlling an output of an output driving signal according to a maintained voltage value.

10. The level shifting method of claim 9, wherein the adjusting of the pulse width of the data signal includes adjusting the data signal to have a wider pulse width than the pulse width of the input control signal, or to have a narrower pulse width than a pulse width of the input control signal.

11. The level shifting method of claim 9, wherein the maintaining of the voltage value includes storing the voltage value when the pulse width of the adjusted data signal is wider than the pulse width of the input control signal, and not storing the voltage value when the pulse width of the adjusted data signal is narrower than the pulse width of the input control signal.

12. The level shifting method of claim 9, wherein the controlling of the output of the output driving signal includes outputting the output driving signal when the maintained voltage value is applied, and blocking the output driving signal when the maintained voltage is not applied.

13. The level shifting method of claim 12, further comprising driving a load with a voltage level of the output driving signal.

14. A semiconductor memory device having a level shifter, comprising:
an input control unit suitable for outputting an output control signal according to a pulse width of a data signal and a pulse width of an input control signal; and
an output control unit suitable for controlling an output driving signal according to the output control signal.

15. The semiconductor memory device of claim 14, wherein
the output control unit includes:
a storage unit suitable for storing a voltage value according to the output control signal; and
an output unit suitable for outputting or blocking the output driving signal according to the voltage value stored in the storage unit.

16. The semiconductor device of claim 15, wherein the storage unit includes a capacitor, which stores the voltage value according to a first output control signal when the pulse width of the data signal is wider than the pulse width of the input control signal, and which does not store the voltage value according to a second output control signal when the pulse width of the data signal is narrower than the pulse width of the input control signal.

17. The semiconductor device of claim 15, wherein the output unit includes a transistor, which receives the voltage value stored in the storage unit through a gate terminal of the transistor, the output driving signal through a drain terminal of the transistor, and outputs or blocks the output driving signal as an output signal through a source terminal of the transistor according to the voltage value stored in the storage unit.

18. The level shifter of claim 17, wherein the transistor is switched on and outputs the output driving signal as the output signal through the source terminal when the voltage value of the storage unit is applied through the gate terminal, and switched off and blocks the output driving signal.

* * * * *